(12) United States Patent
Ise et al.

(10) Patent No.: US 8,924,671 B2
(45) Date of Patent: Dec. 30, 2014

(54) SEMICONDUCTOR STORAGE DEVICE AND CONTROL METHOD THEREOF

(75) Inventors: Masahiro Ise, Kawasaki (JP); Osamu Ishibashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 603 days.

(21) Appl. No.: 12/766,408

(22) Filed: Apr. 23, 2010

(65) Prior Publication Data

US 2010/0205394 A1    Aug. 12, 2010

Related U.S. Application Data

(63) Continuation of application No. PCT/JP2007/001208, filed on Nov. 5, 2007.

(51) Int. Cl.
```
G06F 12/00      (2006.01)
G11C 29/00      (2006.01)
G11C 8/12       (2006.01)
G11C 16/04      (2006.01)
```
(52) U.S. Cl.
CPC  *G11C 8/12* (2013.01); *G11C 29/88* (2013.01); *G11C 16/0483* (2013.01)
USPC .......................................... 711/163; 714/6.11

(58) Field of Classification Search
USPC .......................................... 711/163; 714/6.11
See application file for complete search history.

(56) References Cited

U.S. PATENT DOCUMENTS

| 5,689,463 A | 11/1997 | Murakami et al. |
| 5,864,661 A | 1/1999 | Ohara |
| 6,016,560 A | 1/2000 | Wada et al. |
| 6,288,940 B1 | 9/2001 | Kawamura |
| 6,772,274 B1 * | 8/2004 | Estakhri ........................ 711/103 |
| 7,675,776 B2 * | 3/2010 | Allen et al. .............. 365/185.09 |
| 2001/0012216 A1 | 8/2001 | Taura et al. |
| 2003/0110411 A1 * | 6/2003 | Harari et al. ..................... 714/8 |
| 2003/0217200 A1 * | 11/2003 | Yoshioka ......................... 710/3 |
| 2004/0236909 A1 | 11/2004 | Shikata et al. |
| 2008/0109591 A1 | 5/2008 | Kim et al. |

FOREIGN PATENT DOCUMENTS

| JP | 63-59618 | 3/1988 |
| JP | 4-351800 | 12/1992 |
| JP | 5-4697 | 1/1993 |
| JP | 11-65941 | 3/1999 |
| JP | 11-345174 | 12/1999 |
| JP | 3112018 | 9/2000 |
| JP | 2001-195892 | 7/2001 |
| JP | 2001-273798 | 10/2001 |
| KR | 2000-0071465 | 11/2000 |
| KR | 10-0781976 | 12/2007 |

(Continued)

OTHER PUBLICATIONS

Japanese Notice of Rejection Grounds mailed Jan. 10, 2012 issued in corresponding Japanese Patent Application No. 2009-539881.

(Continued)

*Primary Examiner* — Kalpit Parikh
(74) *Attorney, Agent, or Firm* — Staas & Halsey LLP

(57) ABSTRACT

When an address indicating an access destination of a data storing unit, and a command indicating a content of a process for the address are input, block information corresponding to the input address is output from an information holding unit. Whether or not to execute the command for the address is decided on the basis of the output block information and the input command.

10 Claims, 18 Drawing Sheets

(56) References Cited

FOREIGN PATENT DOCUMENTS

| TW | 368633 | 9/1999 |
| TW | 465081 | 11/2001 |
| WO | 97/00518 | 1/1997 |
| WO | 2004/077447 A1 | 9/2004 |

OTHER PUBLICATIONS

Korean Office Action issued Jun. 2, 2011 in corresponding Korean Patent Application Oct. 2010-7008844.
Chinese Office Action dated Apr. 5, 2012 issued in corresponding Chinese Patent Application No. 200780101257.4.

* cited by examiner

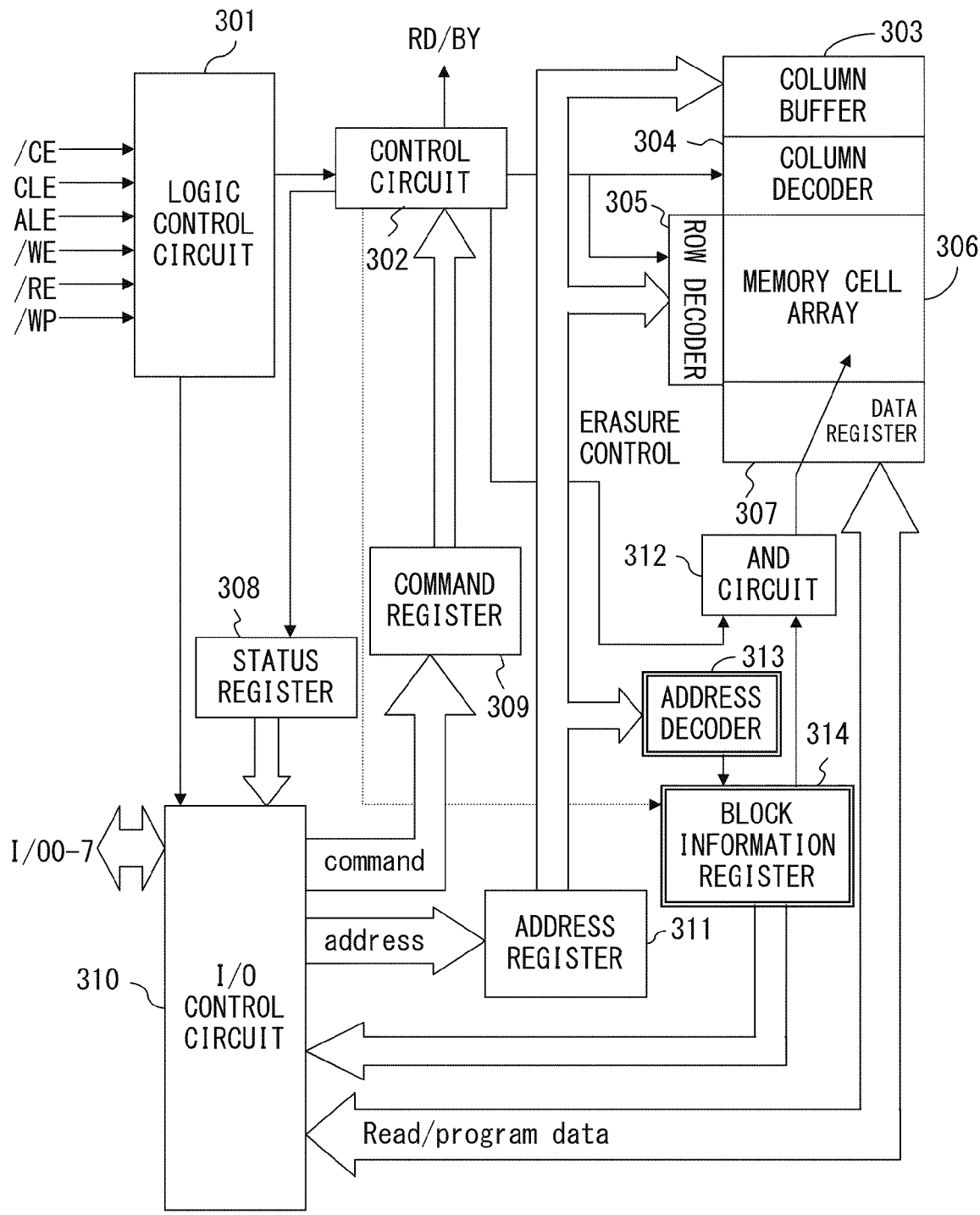
F I G. 3

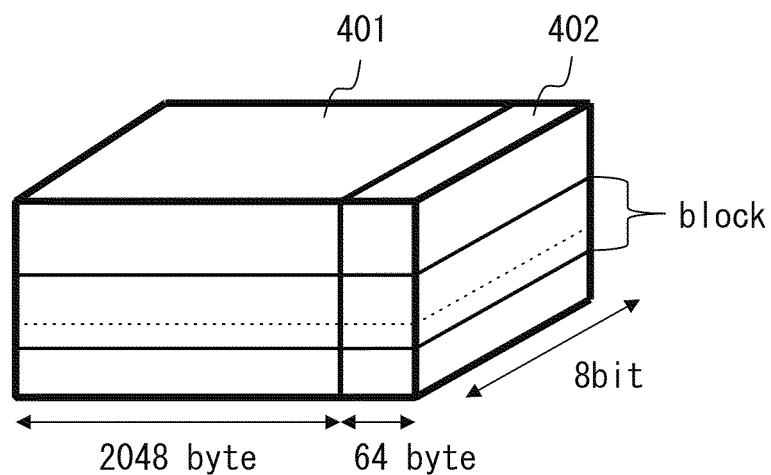
F I G. 4

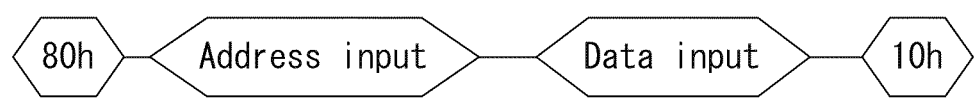
F I G. 6

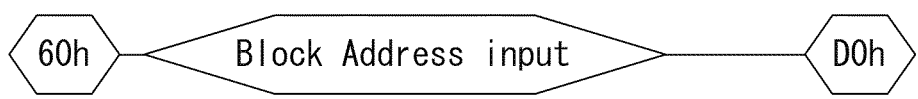
F I G. 7

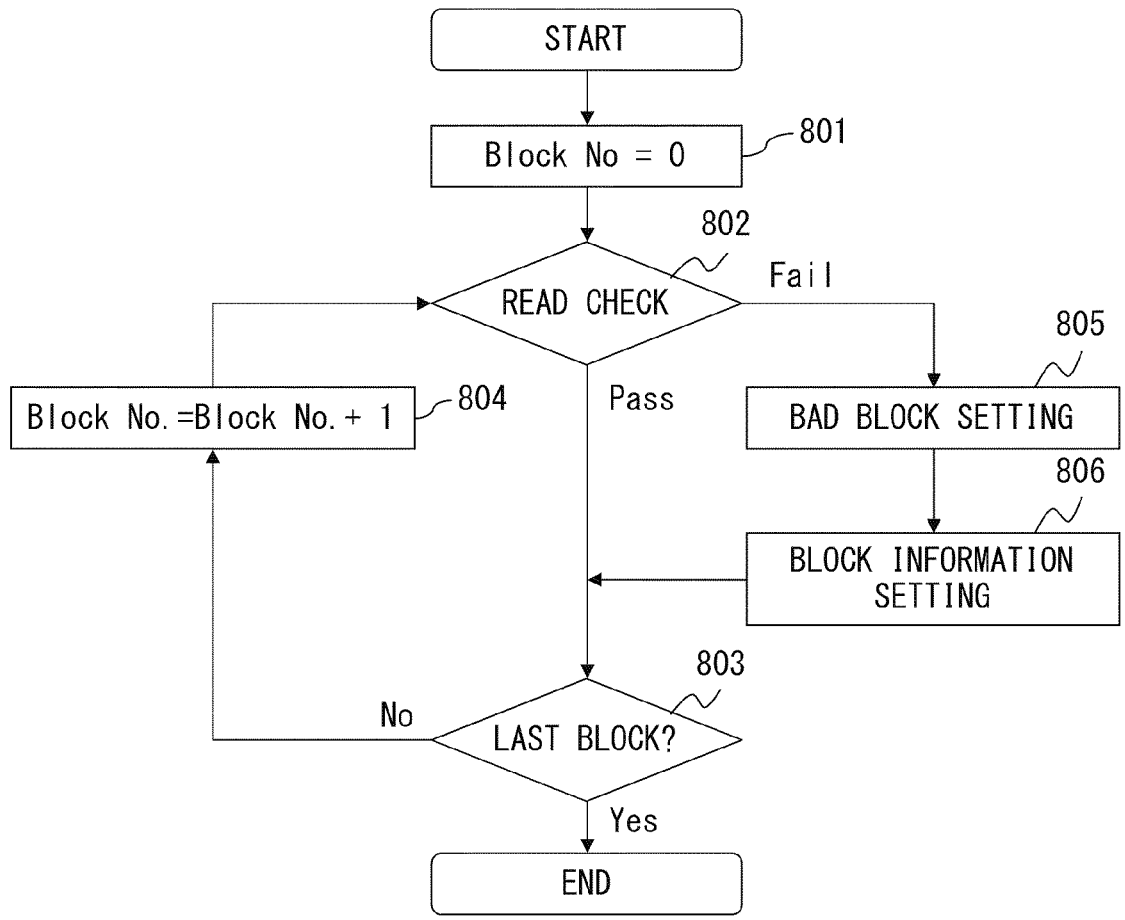
F I G. 8

BLOCK NUMBER  0 1 2 3 4 5 6 · · · ·

LOGIC         1 1 0 1 1 1 1 · · · ·

F I G. 1 0

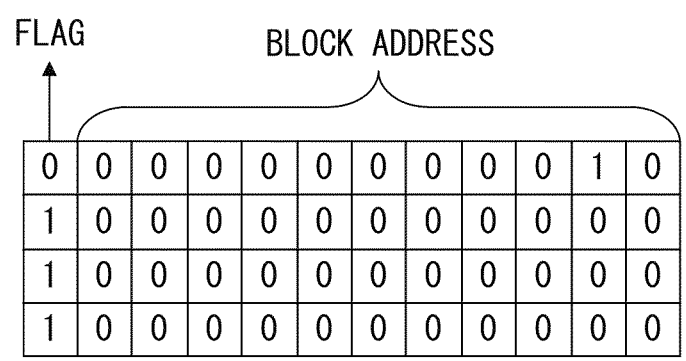
F I G. 1 2

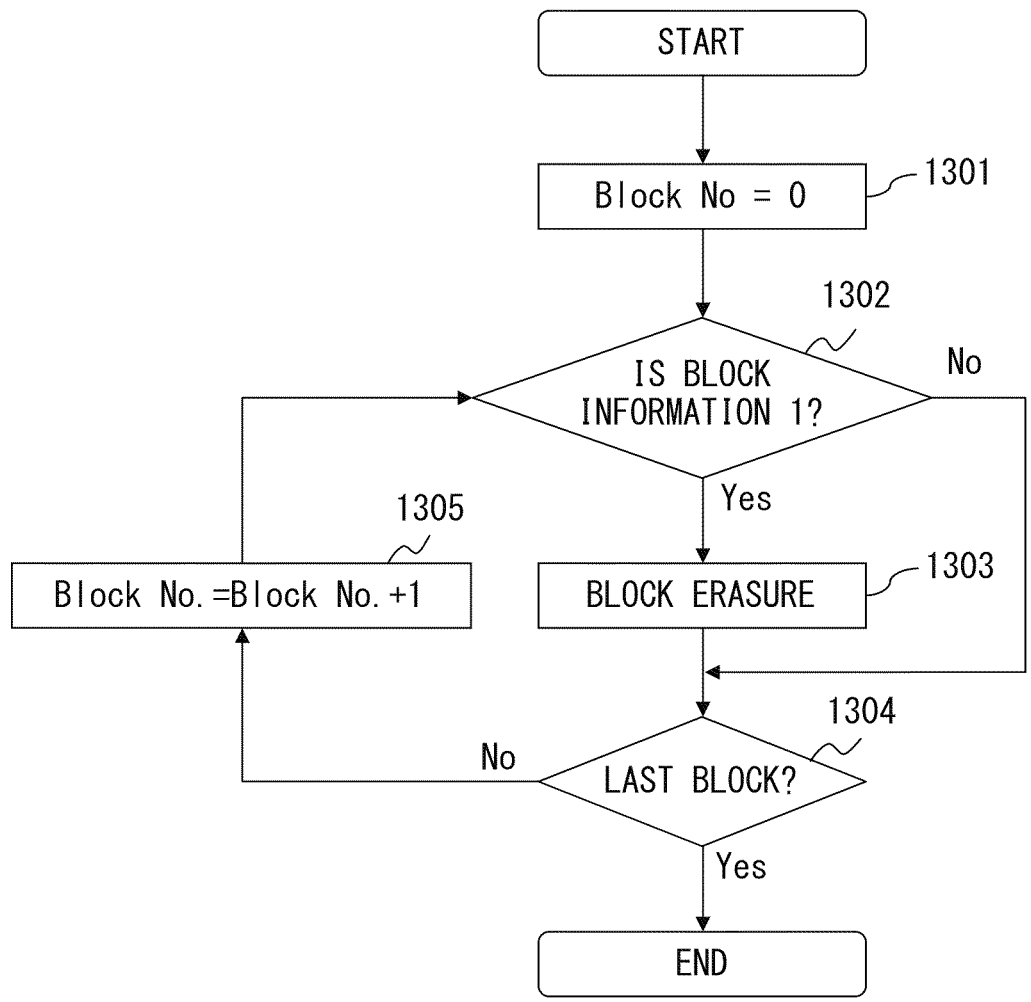
F I G. 13

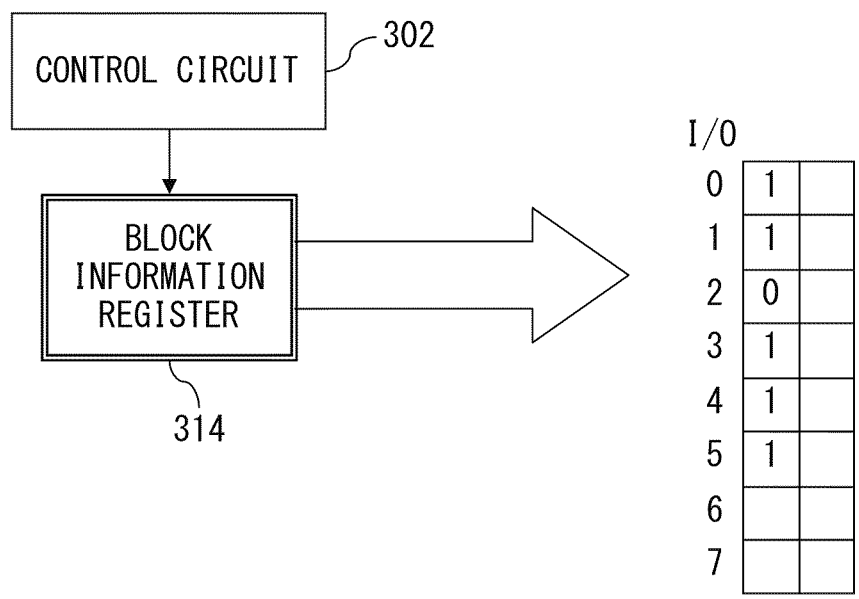
F I G. 1 4

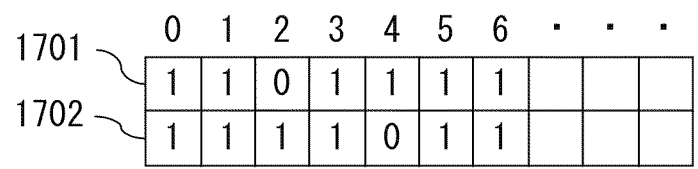
F I G. 17

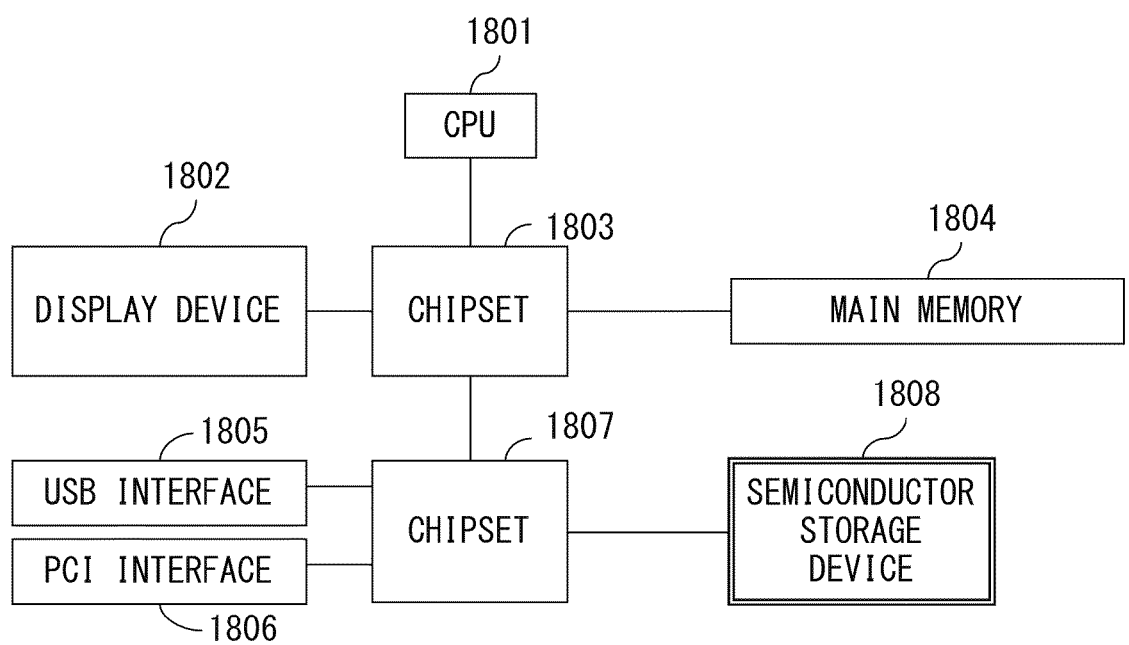
F I G. 1 8

SEMICONDUCTOR STORAGE DEVICE AND CONTROL METHOD THEREOF

CROSS-REFERENCE TO RELATED APPLICATIONS

This application is a continuation application of International PCT Application No. PCT/JP2007/001208 which was filed on Nov. 5, 2007.

FIELD

The embodiments discussed herein relate to a semiconductor storage device having a function for deciding whether or not to execute a command for a particular address, and a control method thereof.

BACKGROUND

In electronic appliances such as an information processing device and the like, a NAND flash memory and an AND flash memory have been recently used as a nonvolatile semiconductor storage device other than a main memory.

FIG. 1 illustrates a configuration of a conventional NAND flash memory. This NAND flash memory includes a logic control circuit 101, a control circuit 102, a column buffer 103, a column decoder 104, a row decoder 105, a memory cell array 106, a data register 107, a status register 108, a command register 109, an I/O control circuit 110, and an address register 111.

Various types of commands, an address and write data are input to the I/O control circuit 110 via an 8-bit interface of I/O 0-7, and data read from the memory cell array 106 is output from the I/O control circuit 110 via the I/O 0-7. An input address is transferred to the column buffer 103 and the row decoder 105 via the address register 111, and an input command is transferred to the control circuit 102 via the command register 109. Input write data is transferred to the data register 107.

The column buffer 103 holds a column address, and the column decoder 104 decodes the column address. The row decoder 105 decodes a row address. The data register 107 holds data read from a decoded address, and also holds data written to a decoded address.

Control signals such as a chip enable signal /CE, a command latch enable signal CLE, an address latch enable signal ALE, a write enable signal /WE, a read enable signal /RE, a write protect signal /WP and the like are input to the logic control circuit 101 from outside. The logic control circuit 101 and the control circuit 102 control various types of operations such as a read from the flash memory, a write to the flash memory, an erasure of the flash memory, verification of the flash memory, and the like on the basis of an input control signal.

On the basis of a command and a control signal, the control circuit 102 controls operations of the column decoder 104 and the row decoder 105, and also controls erasure of the memory cell array 106. Moreover, the control circuit 102 outputs a ready/busy signal RD/BY indicating an operational state to outside, and stores, in the status register 108, information indicating whether or not a write/erasure has been properly terminated. This information is output via the I/O control circuit 110 to outside.

In such a flash memory, it is necessary that a block where a bad bit exists in a memory cell is defined as a bad block and the block is not used to hold data in order to implement a large capacity and a low price. By defining a bad block, the flash memory as a product is enabled to be shipped without being regarded as a defective product.

Methods for identifying a bad block are diverse. Normally, manufacturers mark a bad block by writing data other than logic "1" to a corresponding block, and ship a flash memory. Accordingly, data in all areas or data at a predetermined address is once read to detect a bad block.

FIG. 2 is a flowchart illustrating a bad block generation process executed by a conventional test device. The test device initially sets a block number to "0" (step 201), and checks whether or not a read operation is properly performed from the block (step 202). If the read operation is properly performed as a result of the check, the test device checks whether or not the block number is the last number (step 203). If the block number is not the last number, the test device increments the block number by 1 (step 204), and repeats the processes in and after step 202.

If the read operation is not properly performed as a result of the check in step 202, the test device writes, to the block, a management code indicating a bad block (step 205), and repeats the processes in and after step 203. When the block number reaches the last number, the test device terminates the process.

The following Patent Document 1 relates to a semiconductor storage device having a circuit configuration where a high voltage is not applied to a bad block in test mode. Patent Document 2 relates to a method for examining a memory card without destroying initial bad information stored in a flash memory. Patent Document 3 relates to a method for reducing a test time of a nonvolatile semiconductor memory.

Patent Document 1: Japanese Laid-open Patent Publication No. H8-106796
Patent Document 2: Japanese Laid-open Patent Publication No. H7-306922
Patent Document 3: Japanese Laid-open Patent Publication No. 2001-273798

SUMMARY

According to an aspect of the embodiment, a semiconductor storage device includes a storing unit, an address input unit, a command input unit, an information holding unit, and a deciding unit. The storing unit holds data. An address indicating an access destination of the storing unit is input to the address input unit, whereas a command indicating a content of a process executed for the address is input to the command input unit. The information holding unit holds block information for each address, and outputs block information corresponding to the input address. The deciding unit decides whether or not to execute the command for the address on the basis of a result output from the information holding unit for the address and the command.

According to another aspect of the embodiment, an electronic appliance includes a storing unit, an address input unit, a command input unit, an information holding unit, and a deciding unit. The storing unit holds data. An address indicating an access destination of the storing unit is input to the address input unit, whereas a command indicating a content of a process executed for the address is input to the command input unit. The information holding unit holds block information for each address, and outputs block information corresponding to the input address. The deciding unit decides whether or not to execute the command for the address on the basis of a result output from the information holding unit for the address and the command.

According to a further aspect of the embodiment, a control device includes an address input unit, a command input unit, an information holding unit, and a deciding unit. An address indicating an access destination of data is input to the address input unit, whereas a command indicating a content of a process executed for the address is input to the command input unit. The information holding unit holds block information for each address, and outputs block information corresponding to the input address. The deciding unit decides whether or not to execute the command for the address on the basis of a result output from the information holding unit for the address and a command.

The object and advantages of the invention will be realized and attained by means of the elements and combinations particularly pointed out in the claims.

It is to be understood that both the foregoing general description and the following detailed description are exemplary and explanatory and are not restive of the invention, as claimed.

BRIEF DESCRIPTION OF DRAWINGS

FIG. 3 illustrates a configuration of a NAND flash memory according to an embodiment;

FIG. 4 illustrates a configuration of a memory cell array;

FIG. 6 illustrates a sequence of a write operation;

FIG. 7 illustrates a sequence of an erasure operation;

FIG. 8 is a flowchart illustrating a bad block generation process in the embodiment;

FIG. 10 illustrates first block information;

FIG. 12 illustrates second block information;

FIG. 13 is a flowchart illustrating operations performed when a collective erasure command is executed;

FIG. 14 illustrates a first read operation;

FIG. 17 illustrates third block information; and

FIG. 18 illustrates a configuration of an information processing device.

DESCRIPTION OF EMBODIMENTS

As described above, a product of a conventional semiconductor storage device is enabled to be shipped without being regarded as a defective product by defining a bad block. However, with a conventional bad block generation process, a management code written to a bad block is erasable. Therefore, if a user erroneously erases data of a corresponding block, it becomes impossible to determine a bad block existing when being shipped by a manufacturer. Therefore, a block not to be originally used is utilized, leading to a possibility of garbled data or the like in use.

Not limited to a NAND flash memory, a similar problem is expected to occur also in electronic appliances including an information processing device, a cellular phone, a game machine, a home electric appliance, a memory card and the like.

Preferred embodiments of the present invention will be explained with reference to accompanying drawings.

In a nonvolatile semiconductor storage device according to an embodiment, an information register for holding block information that indicates whether or not a bad block exists in a memory cell array is provided. As a result, even if a PROGRAM command or an ERASE command is issued for a bad block, the command for the block is suitably prohibited from being executed.

Figure 1:
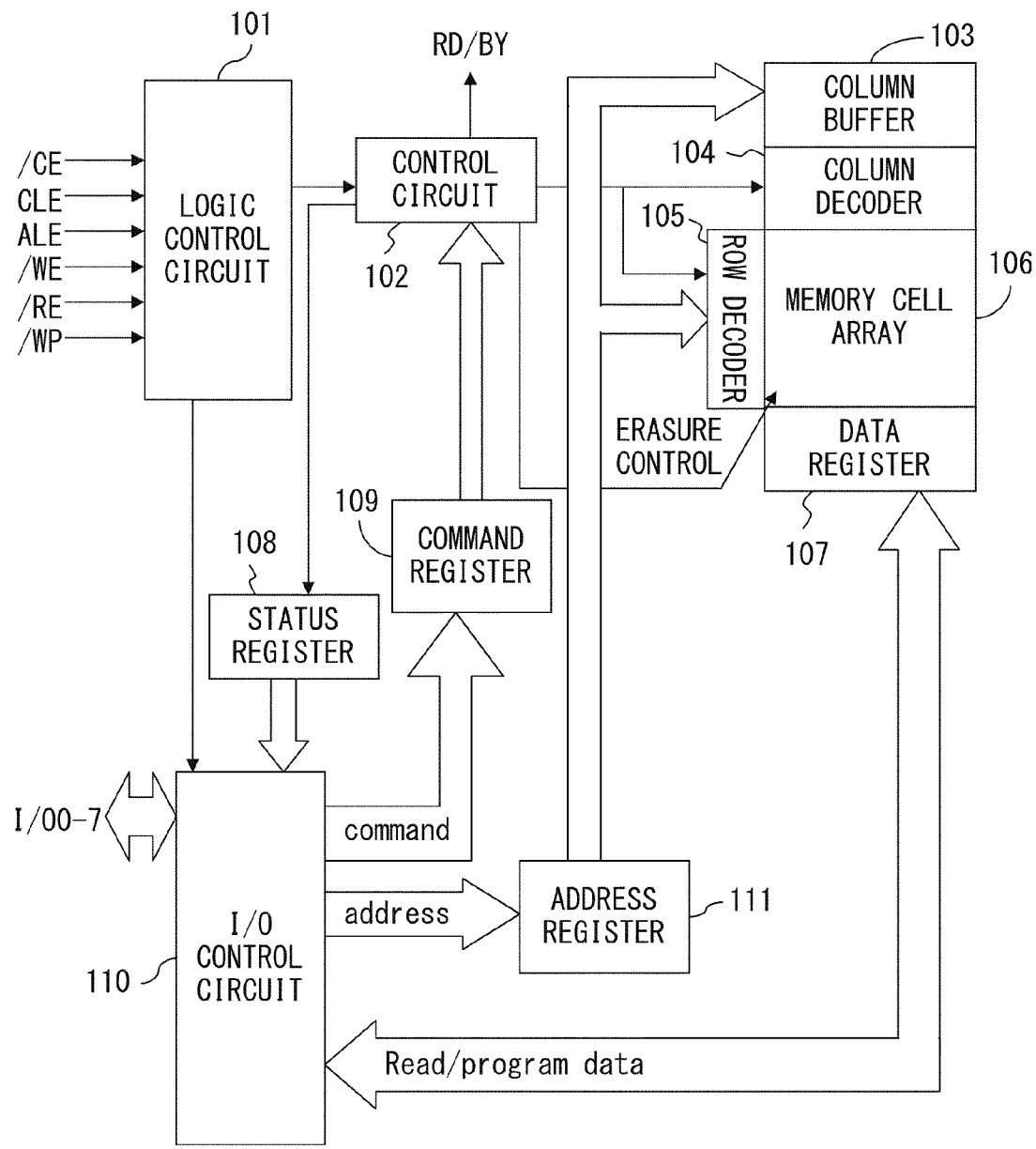
FIG. 1 illustrates a configuration of a conventional NAND flash memory.

FIG. 3 illustrates an example of a configuration of a NAND flash memory having such a protection function. This NAND flash memory includes a logic control circuit 301, a control circuit 302, a column buffer 303, a column decoder 304, a row decoder 305, a memory cell array 306, a data register 307, a status register 308, a command register 309, an I/O control circuit 310, an address register 311, an AND circuit 312, an address decoder 313, and a block information register 314. Basic functions of the components 301 to 311 among the above described components are similar to those of the components 101 to 111 illustrated in FIG. 1.

The block information register 314 holds block information indicating whether or not each block of the memory cell array 306 is a bad block. The address decoder 313 decodes an address held in the address register 311, and outputs the decoded address to the block information register 314. The block information register 314 outputs block information corresponding to the decoded address. The AND circuit 312 erases data of blocks other than a bad block by outputting, to the memory cell array 306, a logical product of the block information and an erasure signal output from the control circuit 302.

On the basis of an input command, the control circuit 302 performs a control for writing block information to the block information register 314, and a control for reading block information from the block information register 314. The read block information is output via the I/O control circuit 310 to outside.

FIG. 4 illustrates an example of a configuration of a memory cell array having a 2G-bit capacity. This memory cell array is composed of 2048 blocks, each of which is partitioned into 64 pages. Each of the pages is composed of a main area 401 of 2048 bytes, and a spare area 402 of 64 bytes. Thus, each of the pages has a capacity of 2112 bytes. A management code indicating a bad block is written to the spare area 402.

Figure 5:
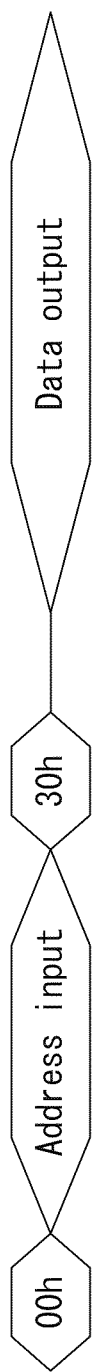
FIG. 5 illustrates a sequence of a read operation.

FIG. 5 illustrates a sequence of a read operation performed in units of pages in the flash memory illustrated in FIG. 3. Initially, a first command 00*h* is input to the I/O control circuit 310. Then, a read address is input. Next, when a second command 30*h* is input, a read operation is started, and data is output from the I/O control circuit 310.

FIG. 6 illustrates a sequence of a write (PROGRAM) operation performed in units of pages in the flash memory illustrated in FIG. 3. Initially, a first command 80*h* is input to the I/O control circuit 310. Then, a write address and write data are input. Next, when a second command 10*h* is input, a write operation is started.

FIG. 7 illustrates a sequence of an erasure operation performed in units of blocks in the flash memory illustrated in FIG. 3. Initially, a first command 60*h* is input to the I/O control circuit 310. Then, a block address is input. Next, when a second command D0*h* is input, an erasure operation is started.

Figure 2:
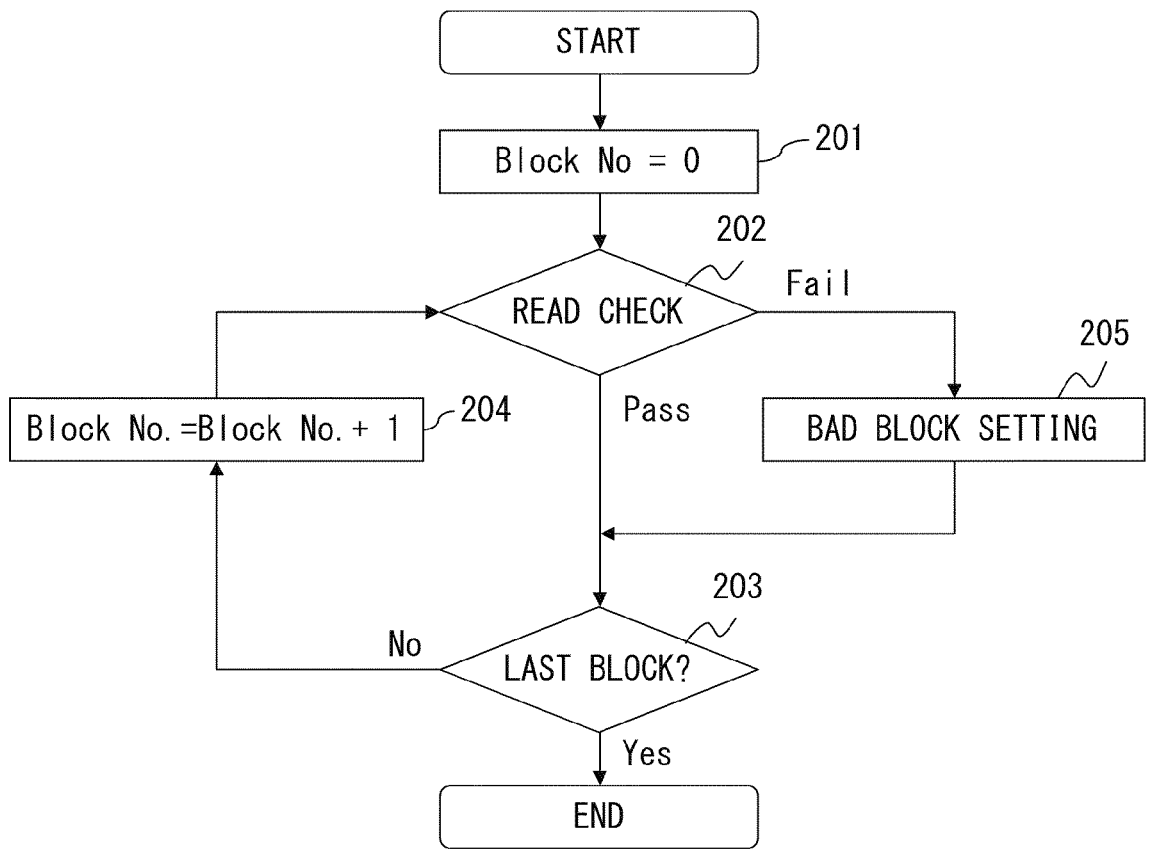
FIG. 2 is a flowchart illustrating a conventional bad block generation process.

FIG. 8 is a flowchart illustrating a bad block generation process executed for the flash memory illustrated in FIG. 3. Processes in steps 801 to 805 are similar to those insteps 201 to 205 of FIG. 2. When a management code is written to a bad block in step 805, a test device writes, to the block information register 314, block information indicating the position of the bad block (step 205). Then, the test device repeats processes in and after step 803. With such a bad block generation process, block information indicating the position of each bad block is set in the block information register 314.

As described above, block information for protecting a bad block is set when the bad block is generated, whereby data of the protected bad block is not erased even though an erasure is performed. This eliminates the need for again determining a bad block and writing a management code.

A specific example of the protection function using block information is described next with reference to FIGS. 9 to 12.

Figure 9:
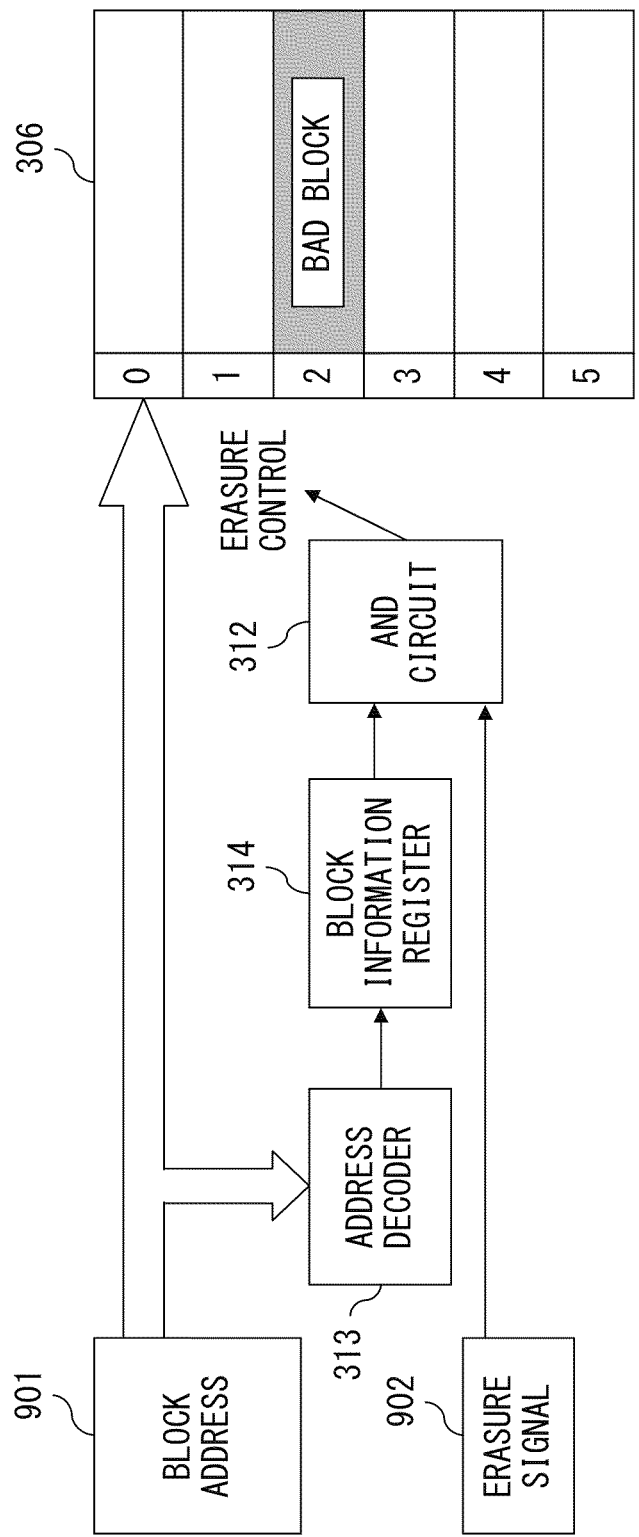
FIG. 9 illustrates operations performed when a first erasure command is executed.

FIG. 9 illustrates operations performed when the erasure command is executed in the flash memory illustrated in FIG. 3. The block information register 314 holds block information corresponding to each block number as illustrated in FIG. 10. In this example, the block information indicates that a corresponding block is a good block if the logic of the block information is "1", or the block information indicates that a corresponding block is a bad block if the logic of the block information is "0".

When a block address 901 to be erased and the erasure command are input to the flash memory, the control circuit 302 outputs an erasure signal 902, the logic of which is "1", to the AND circuit 312. The address decoder 313 decodes the block address 901, and outputs a decoding result to the block information register 314.

The block information register 314 outputs block information corresponding to the block number indicated by the output of the address decoder 313. The AND circuit 312 outputs a logical product of the block information and the erasure signal 902 to the memory cell array 306 as an erasure control signal. If the logic of the erasure control signal is "1", data of the block address 901 is erased. If the logic of the erasure control signal is "0", the data of the block address 901 is not erased.

For example, block information of a block 2 is "0". Therefore, the erasure control signal results in "0" if the erasure command is issued for the block 2. Accordingly, data of the bad block 2 is protected without being erased.

Figure 11:
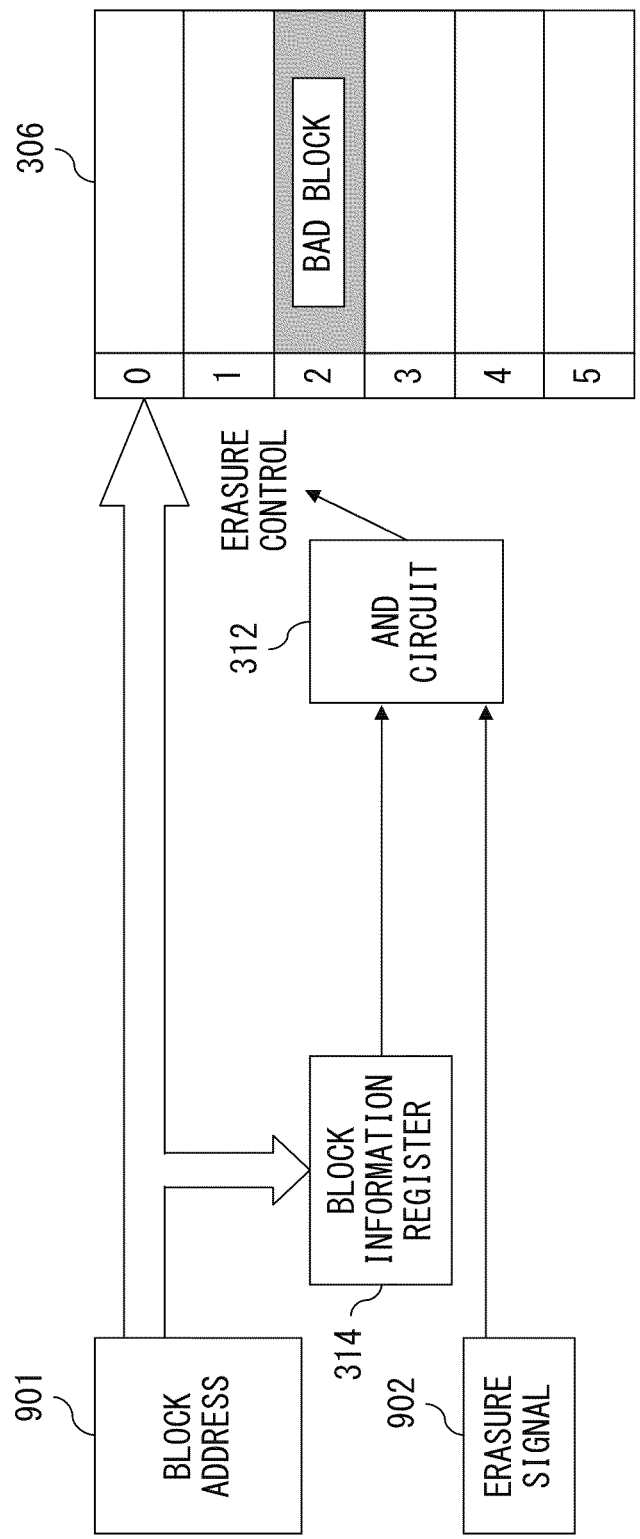
FIG. 11 illustrates operations performed when a second erasure command is executed.

FIG. 11 illustrates an example of another configuration of the protection function using block information. In this case, the address decoder 313 illustrated in FIG. 3 is not provided, and the input block address 901 is directly transferred to the block information register 314.

Additionally, the block information register 314 includes an n-bit register that is capable of holding 2^n block addresses. For example, if n is equal to 11, the block information register 314 holds a 1-bit flag and an 11-bit block address as illustrated in FIG. 12. In this example, if the logic of the flag is "0", this indicates that a corresponding block address is an address of a bad block. In contrast, if the logic of the flag is "1", an initial value is stored as a corresponding block address.

If the block information register 314 detects a block address that matches the block address 901, it outputs the value of the flag corresponding to the block address as block information. Alternatively, if the block information register 314 does not detect the block address that matches the block address 901, it outputs "1" as block information. The AND circuit 312 outputs a logical product of the block information and the erasure signal 902 to the memory cell array 306 as an erasure control signal.

For example, the block address of the block 2 is "00000000010". Therefore, a flag "0" is output from the block information register 314 when the erasure command is issued for the block 2. Accordingly, the erasure control signal results in "0", and the data of the bad block 2 is not erased.

The flag illustrated in FIG. 12 is information that is not always essential. Only a block address of a bad block may be held in the block information register 314. In this case, the block information register 314 outputs "0" as block information if it detects a block address that matches the block address 901. In contrast, the block information register 314 outputs "1" as block information if it does not detect the block address that matches the block address 901.

FIG. 13 is a flowchart illustrating an erasure operation performed when a collective erasure command such as CHIP ERASE is input. Initially, the control circuit 302 sets a block number to 0, and outputs an erasure signal to the AND circuit 312 (step 1301). As a result, an erasure control for the block 0 is performed, and the AND circuit 312 outputs an erasure control signal according to the value of input block information (step 1302).

If the block information is "1", an erasure control signal "1" is output, and data of the target block is erased (step 1303). In contrast, if the block information is "0", an erasure control signal "0" is output and the data of the target block is not erased.

Next, the control circuit 302 checks whether or not the block number is the last number (step 1304). If the block number is not the last number, the control circuit 302 increments the block number by 1 (step S1305), and repeats the processes in and after step 1302. When the block number reaches the last number, the control circuit 302 terminates the operation.

As described above, even though the collective erasure command is input, data of a bad block is protected on the basis of block information, and it becomes possible to erase data of blocks other than the bad block at one time. Accordingly, it is possible to efficiently use the area of the memory cell array 306.

FIG. 14 illustrates an operation for reading the block information depicted in FIG. 10. When a block information read command is input to the flash memory, the control circuit 302 outputs a block information read signal to the block information register 314. The block information register 314 outputs, to the I/O control circuit 310, block information corresponding to all of block numbers 0 to 5. Then, the I/O control circuit 310 assigns the block information of the block numbers 1 to 5 to I/O 0-5, and outputs the block information to a source that has issued the command.

Figure 15:
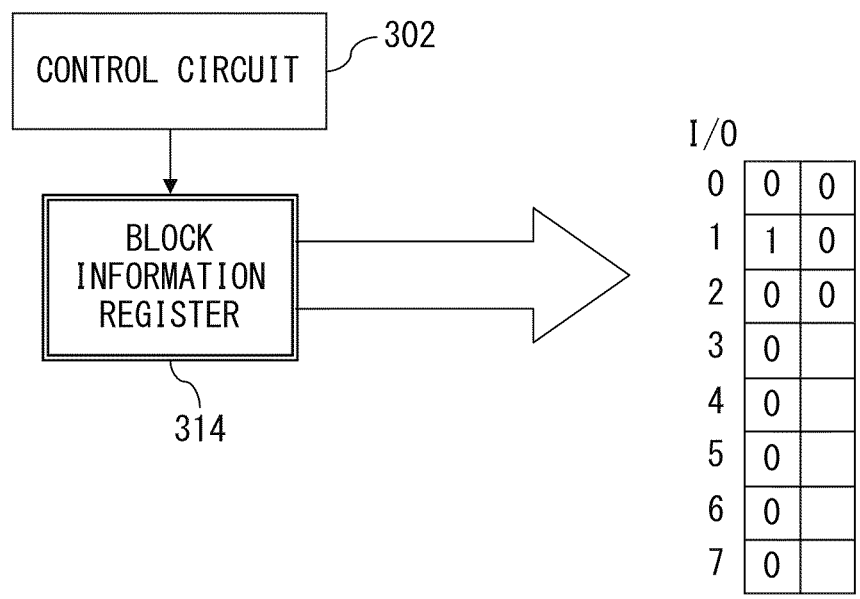
FIG. 15 illustrates a second read operation.

FIG. 15 illustrates an operation for reading the block information illustrated in FIG. 12. When a block information read command is input to the flash memory, the control circuit 302 outputs a block information read signal to the block information register 314. The block information register 314 outputs, to the I/O control circuit 310, a block address of a bad block corresponding to the flag "0". Then, the I/O control circuit 310 outputs the block address to a source that has issued the command via the I/O 0-7.

By confirming the read block information, the source that has issued the command can recognize that the target block is protected.

In the above described preferred embodiment, a bad block is protected by using block information. However, data of blocks other than a bad block may be protected with a similar configuration. For example, it is possible to add a type of a block to be protected by configuring block information illustrated in FIG. 10 with a plurality of bits for each block.

Figure 16:
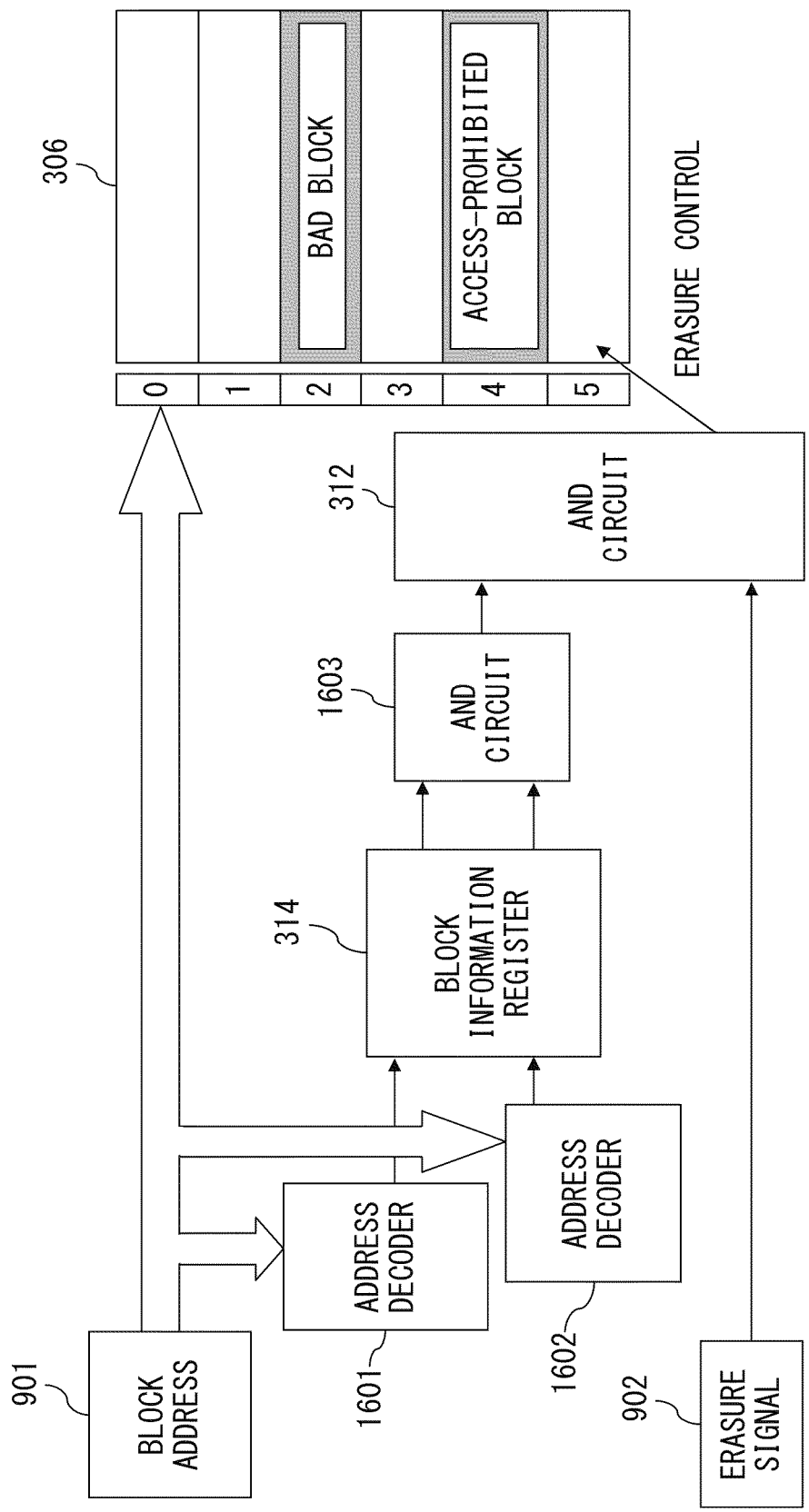
FIG. 16 illustrates operations performed when a third erasure command is executed.

FIG. 16 illustrates an example of another configuration of the protection function using such block information. In this case, address decoders 1601 and 1602 are provided as a replacement for the address decoder 313 illustrated in FIG. 3, and an AND circuit 1603 is interposed between the block information register 314 and the AND circuit 312.

As illustrated in FIG. 17, the block information register 314 holds block information 1701 and 1702 that respectively correspond to block numbers. The block information 1701 among the above described block information corresponds to the block information illustrated in FIG. 10. Moreover, if the logic of the block information 1702 is "1", this indicates that the corresponding block is an access-permitted block. In contrast, if the logic of the block information 1702 is "0", this indicates that the corresponding block is an access-prohibited block.

When a block address 901 to be erased and an erasure command are input to the flash memory, the control circuit 302 outputs an erasure signal 902, the logic of which is "1", to the AND circuit 312. Address decoders 1601 and 1602 respectively decode the block address 901, and output an identical decoding result to the block information register 314.

The block information register 314 outputs the block information 1701 corresponding to the block number indicated by the output of the address decoder 1601, and also outputs the block information 1702 corresponding to the block number indicated by the output of the address decoder 1602. The AND circuit 1603 outputs, to the AND circuit 312, a logical product of the two types of the block information output from the block information register 314. The AND circuit 312 outputs a logical product of the output of the AND circuit 1603 and the erasure signal 902 to the memory cell array 306 as an erasure control signal.

With such a configuration, data of a corresponding block is not erased if either of the block information 1701 and 1702 is "0", and the data is erased only if both the block information 1701 and 1702 are "1". For example, the block information 1702 of a block 4 is "0". Therefore, when an erasure command is issued for the block 4, an erasure control signal results in "0". Accordingly, data of the access-prohibited block 4 is protected without being erased.

A bad block and an access-prohibited block are indicated by using different pieces of block information, whereby it becomes possible to easily determine a cause of a denied access when data is read with a block information read command.

Two types of flags such as a flag that indicates a bad block, and a flag that indicates an access-prohibited block are provided also when the block information in the format of FIG. 12 is used, whereby a control similar to that illustrated in FIG. 16 is enabled to be performed.

In the meantime, FIGS. 9, 11 and 16 respectively represent the operations performed when the erasure command is input. Also when a write command is input, data of a bad block and an access-prohibited block are similarly protected. In this case, a write control signal is output to the memory cell array 306 as a replacement for an erasure control signal, and write data is written to an input write address. However, if a write destination is a bad block or an access-prohibited block, a write operation is not performed.

FIG. 18 illustrates an example of a configuration of an information processing device including a semiconductor storage device having a block information register. This information processing device includes a Central Processing Unit (CPU) 1801, a display device 1802, chipsets 1803 and 1807, a main memory 1804, a Universal Serial Bus (USB) interface 1805, a Peripheral Components Interconnect (PCI) interface 1806, and a semiconductor storage device 1808.

The CPU 1801 uses the semiconductor storage device 1808 as an external storage device. The CPU 1801 reads data from the semiconductor storage device 1808 into the main memory 1804, and executes information processing. Processing results are displayed on a screen of the display device 1802, and stored in the semiconductor storage device 1808. The CPU 1801 periodically obtains block information from the semiconductor storage device 1808 with the above described block information read command, and is enabled to control the issuance of a command to the semiconductor storage device 1808.

The semiconductor storage device according to the embodiment is widely used in electronic appliances including an information processing device, a cellular phone, a game machine, a home electric appliance, a memory card and the like.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor storage device, comprising:
    a storing unit configured to hold data;
    an address input unit to which an address indicating an access destination of the storing unit is input;
    a command input unit to which a command indicating a content of a process for the address is input;
    an information holding unit configured to hold an address of a bad block and an address of an access-prohibited block to detect an address that matches the address input by the address input unit, to output first block information indicating that the address input by the address input unit is the address of the bad block when the address of the bad block that matches the address input by the address input unit is detected and indicating that the address input by the address input unit is not the address of the bad block when the address of the bad block that matches the address input by the address input unit is not detected, and to output second block information indicating that the address input by the address input unit is the address of the access-prohibited block when the address of the access-prohibited block that matches the address input by the address input unit is detected and indicating that the address input by the address input unit is not the address of the access-prohibited block when the address of the access-prohibited block that matches the address input by the address input unit is not detected; and
    a deciding unit configured to decide whether to execute the command for the address input by the address input unit based on the command for the address and a logical product of the first block information and the second block information output from the information holding unit for the address input by the address input unit.

2. The semiconductor storage device according to claim 1, further comprising an output unit configured to output the address of the bad block and the address of the access-prohibited block held in the information holding unit.

3. The semiconductor storage device according to claim 1, wherein the deciding unit decides whether or not to execute the command for the address on the basis of the command for the address and the logical product of the first block information and the second block information output from the information holding unit when a collective erasure command is input by the command input unit.

4. An electronic appliance, comprising:
   a storing unit configured to hold data;
   an address input unit to which an address indicating an access destination of the storing unit is input;
   a command input unit to which a command indicating a content of a process for the address is input;
   an information holding unit configured to hold an address of a bad block and an address of an access-prohibited block, to detect an address the matches the address input by the address input unit, to output first block information indicating that the address input by the address input unit is the address of the bad block when the address of the bad block that matches the address input by the address input unit is detected and indicating that the address input by the address input unit is not the address of the bad block when the address of the bad block that matches the address input by the address input unit is not detected, and to output second block information indicating that the address input by the address input unit is the address of the access-prohibited block when the address of the access-prohibited block that matches the address input by the address input unit is detected and indicating that the address input by the address input unit is not the address of the access-prohibited block when the address of the access-prohibited block that matches the address input by the address input unit is not detected; and
   a deciding unit configured to decide whether to execute the command for the address input by the address input unit based on the command for the address and a logical product of the first block information and the second block information output from the information holding unit for the address input by the address input unit.

5. The electronic appliance according to claim 4, further comprising an output unit configured to output the address of the bad block and the address of the access-prohibited block held in the information holding unit.

6. The electronic appliance according to claim 4, wherein the deciding unit decides whether or not to execute the command for the address on the basis of the command for the address and the logical product of the first block information and the second block information output from the information holding unit, when a collective erasure command is input by the command input unit.

7. A control apparatus, comprising:
   an I/O control circuit to which an address indicating an access destination of data and a command indicating a content of a process for the address are input;
   a block information register configured to hold an address of a bad block and an address of an access-prohibited block, to detect an address that matches the input address, to output first block information indicating that the input address is the address of the bad block when the address of the bad block that matches the input address is detected and indicating that the input address is not the address of the bad block when the address of the bad block that matches the input address is not detected, and to output second block information indicating that the input address is the address of the access-prohibited block when the address of the access-prohibited block that matches the input address is detected and indicating that the input address is not the address of the access-prohibited block when the address of the access-prohibited block that matches the input address is not detected; and
   an AND circuit configured to decide whether to execute the command for the input address based on the command for the input address and a logical product of the first block information and the second block information output from the information register for the input address.

8. The control apparatus according to claim 7, further comprising an output unit configured to output the address of the bad block and the address of the access-prohibited block held in the information register.

9. The control apparatus according to claim 7, wherein the AND circuit decides whether to execute the command for the input address on the basis of the command for the input address and the logical product of the first block information and the second block information output from the block information register, when a collective erasure command is input to the I/O control circuit.

10. A control method for use in a semiconductor storage device, the control method comprising:
    inputting an address indicating an access destination of data held in a semiconductor storage device, and a command indicating a content of a process for the address;
    detecting an address that matches the input address in an information holding unit configured to hold an address of a bad block and an address of an access-prohibited block;
    outputting from the information holding unit first block information indicating that the input address is the address of the bad block when the address of the bad block that matches the input address is detected and indicating that the input address is not the address of the bad block when the address of the bad block that matches the input address is not detected, and outputting from the information holding unit second block information indicating that the input address is the address of the access-prohibited block when the address of the access-prohibited block that matches the input address is detected and indicating that the input address is not the address of the access-prohibited block when the address of the access-prohibited block that matches the input address is not detected; and
    deciding whether or not to execute the command for the address on the basis of the command for the address and a logical product of the first block information and the second block information output from the information holding unit for the input address.

* * * * *